United States Patent
Nagaoka et al.

(10) Patent No.: US 11,142,842 B2
(45) Date of Patent: Oct. 12, 2021

(54) FILM FORMATION APPARATUS AND FILM FORMATION METHOD

(71) Applicants: DENSO CORPORATION, Aichi-pref (JP); NATIONAL UNIVERSITY CORPORATION KYOTO INSTITUTE OF TECHNOLOGY, Toyota (JP)

(72) Inventors: Tatsuji Nagaoka, Nagakute (JP); Fumiaki Kawai, Miyoshi (JP); Hiroyuki Nishinaka, Kyoto (JP); Masahiro Yoshimoto, Kyoto (JP)

(73) Assignees: DENSO CORPORATION, Kariya (JP); NATIONAL UNIVERSITY CORPORATION KYOTO INSTITUTE OF TECHNOLOGY, Kyoto (JP)

( * ) Notice: Subject to any disclaimer, the term of this patent is extended or adjusted under 35 U.S.C. 154(b) by 0 days.

(21) Appl. No.: 16/705,432

(22) Filed: Dec. 6, 2019

(65) Prior Publication Data
US 2020/0181795 A1 Jun. 11, 2020

(30) Foreign Application Priority Data
Dec. 11, 2018 (JP) .............................. JP2018-231958

(51) Int. Cl.
| | |
|---|---|
| *C30B 23/00* | (2006.01) |
| *C30B 7/00* | (2006.01) |
| *C30B 29/16* | (2006.01) |
| *C30B 19/08* | (2006.01) |
| *C30B 7/14* | (2006.01) |

(52) U.S. Cl.
CPC ................ *C30B 7/005* (2013.01); *C30B 7/14* (2013.01); *C30B 19/08* (2013.01); *C30B 29/16* (2013.01)

(58) Field of Classification Search
CPC .. C30B 35/00; C30B 7/02; C30B 7/04; C30B 23/00; C30B 25/00
See application file for complete search history.

(56) References Cited

U.S. PATENT DOCUMENTS

| | | | | |
|---|---|---|---|---|
| 6,110,531 A | * | 8/2000 | Paz de Araujo | ......... B05D 1/00 427/255.25 |
| 6,143,063 A | * | 11/2000 | Hayashi | ............ H01L 27/11502 106/287.18 |

(Continued)

FOREIGN PATENT DOCUMENTS

| | | |
|---|---|---|
| CN | 204455392 U | 7/2015 |
| CN | 107895742 A | 4/2018 |

(Continued)

*Primary Examiner* — Robert M Kunemund
(74) *Attorney, Agent, or Firm* — Sughrue Mion, PLLC

(57) ABSTRACT

A film formation apparatus is configured to supply mist of a solution to a surface of a substrate so as to grow a film on the surface of the substrate, and the film formation apparatus may include: a furnace configured to house the substrate so as to heat the substrate; and a mist supply apparatus configured to supply the mist of the solution to the furnace, in which the film formation apparatus includes a portion configured to be exposed to the mist, and at least a part of the portion of the film formation apparatus is constituted of a material comprising boron nitride.

2 Claims, 2 Drawing Sheets

(56) References Cited

U.S. PATENT DOCUMENTS

| | | | | |
|---|---|---|---|---|
| 8,728,241 B2* | 5/2014 | Kelekar | ................... | C23C 26/00 |
| | | | | 118/719 |
| 2012/0148742 A1* | 6/2012 | Kelekar | ................... | C23C 18/06 |
| | | | | 427/248.1 |
| 2014/0011342 A1* | 1/2014 | Kapur | ................... | C23C 18/1295 |
| | | | | 438/478 |
| 2016/0236937 A1* | 8/2016 | Wang | ................... | B01J 19/02 |
| 2018/0097073 A1 | 4/2018 | Oda et al. | | |

FOREIGN PATENT DOCUMENTS

| | | |
|---|---|---|
| JP | 2015-070248 A | 4/2015 |
| JP | 2018-129500 A | 8/2018 |

* cited by examiner

FILM FORMATION APPARATUS AND FILM FORMATION METHOD

CROSS-REFERENCE TO RELATED APPLICATION(S)

This application claims priority to Japanese Patent Application No. 2018-231958, filed on Dec. 11, 2018, the entire contents of which are incorporated herein by reference.

TECHNICAL FIELD

The technology disclosed herein relates to a film formation apparatus and a film formation method.

BACKGROUND

Japanese Patent Application Publication No. 2015-070248 discloses a film formation apparatus configured to supply mist of a solution to a surface of a substrate so as to grow a film on the surface of the substrate. This film formation apparatus includes: a furnace configured to house the substrate so as to heat the substrate; and a mist supply apparatus configured to supply the mist of the solution to the furnace. The mist adheres to the surface of the substrate in the furnace, so that the film is grown on the surface of the substrate.

SUMMARY

The film formation apparatus in Japanese Patent Application Publication No. 2015-070248 includes a portion configured to be exposed to the mist, and this portion is usually constituted of quartz which has superior heat resistance and chemical stability. However, an analysis of a formed film grown by a film formation apparatus of this type revealed that this film contains silicon. It can be considered that because silicon leaches from quartz of the film formation apparatus into the mist, and included (gets mixed) into the film. As such, there may be a case where unintended impurities (silicon or the like) attributed to a material that constitutes the film formation apparatus are captured in the film during film formation, thereby causing a failure to accurately control characteristics of the film. The present specification proposes a film formation apparatus capable of reducing inclusion of unintended impurities into a film.

The film formation apparatus disclosed herein is configured to supply mist of a solution to a surface of a substrate so as to grow a film on the surface of the substrate. This film formation apparatus may comprise: a furnace configured to house the substrate so as to heat the substrate; and a mist supply apparatus configured to supply the mist of the solution to the furnace. The film formation apparatus includes a portion configured to be exposed to the mist, and at least a part of the portion of the film formation apparatus is constituted of a material containing boron nitride.

At least a part of the portion of this film formation apparatus, which portion is configured to be exposed to the mist, is constituted of the material containing boron nitride. Boron nitride has high heat resistance and superior chemical stability. Allowing at least a part of the portion configured to be exposed to the mist to be constituted of the material containing boron nitride, therefore, can reduce inclusion of unintended impurities into a film to be grown.

DETAILED DESCRIPTION

First Embodiment

Figure 1:
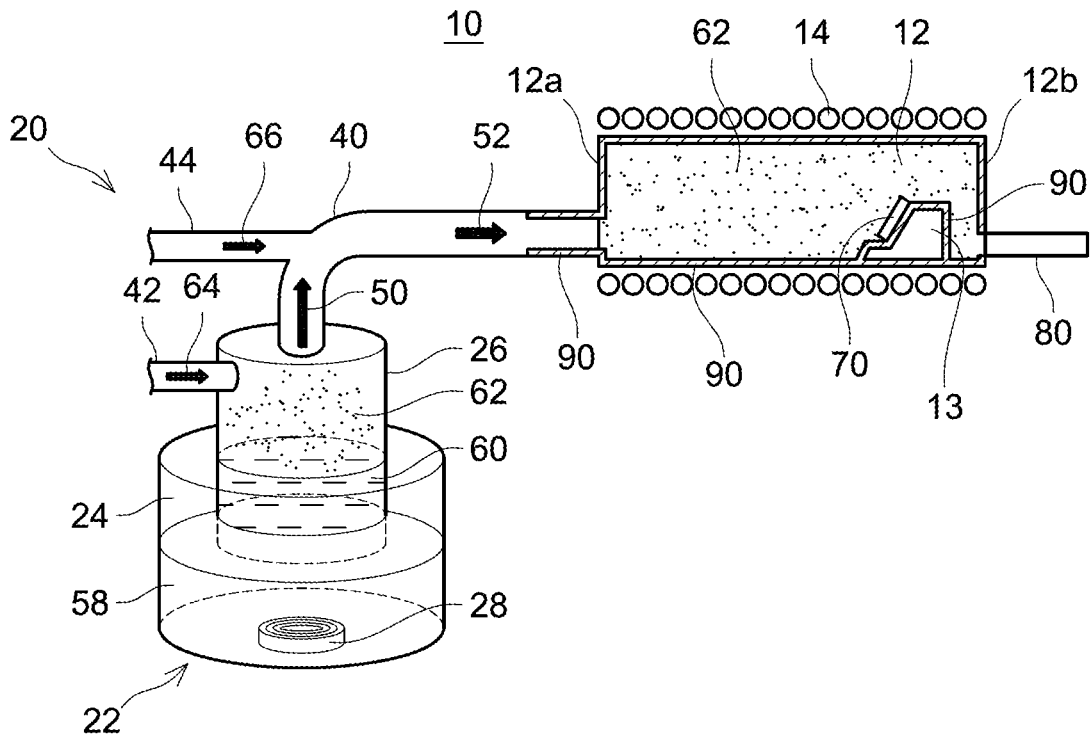
FIG. 1 is a configuration diagram of a film formation apparatus in a first embodiment.

A film formation apparatus 10 shown in FIG. 1 is an apparatus configured to epitaxially grow a film on a surface of a substrate 70 having a plate shape. The film formation apparatus 10 comprises a furnace 12 in which the substrate 70 is placed, a heater 14 configured to heat the furnace 12, a mist supply apparatus 20 connected to the furnace 12, and an exhaust pipe 80 connected to the furnace 12.

A specific configuration of the furnace 12 is not limited to a particular one. As an example, the furnace 12 shown in FIG. 1 is a tubular furnace extending from an upstream end 12a to a downstream end 12b. A cross section of the furnace 12, perpendicular to its longitudinal direction, is circular. However, the cross section of the furnace 12 is not limited to a circular one. The furnace 12 has an inner surface coated with a coating layer 90. In a first embodiment, the coating layer 90 is boron nitride (PBN: Pyrolytic Boron Nitride). In other words, the furnace 12 includes a portion configured to be exposed to mist, and this portion is constituted of boron nitride.

The mist supply apparatus 20 is connected to the upstream end 12a of the furnace 12. The exhaust pipe 80 is connected to the downstream end 12b of the furnace 12. The mist supply apparatus 20 is configured to supply mist 62 into the furnace 12. The mist 62 that has been supplied into the furnace 12 by the mist supply apparatus 20 flows through the furnace 12 to its downstream end 12b, and is then discharged to an outside of the furnace 12 via the exhaust pipe 80.

A substrate stage 13 for supporting the substrate 70 is provided in the furnace 12. The substrate stage 13 is configured such that the substrate 70 is tilted relative to the longitudinal direction of the furnace 12. The substrate 70 supported by the substrate stage 13 is supported in an orientation that allows the mist 62 flowing through the furnace 12 from the upstream end 12a toward the downstream end 12b to be applied on the surface of the substrate 70. The substrate stage 13 has a surface coated with the coating layer 90 (boron nitride). In other words, the substrate stage 13 includes a portion configured to be exposed to the mist 62, and this portion is constituted of boron nitride.

As mentioned before, the heater 14 is configured to heat the furnace 12. A specific configuration of the heater 14 is not limited to a particular one. As an example, the heater 14 shown in FIG. 1 is an electric heater, and is placed along an outer peripheral wall of the furnace 12. The heater 14 heats the outer peripheral wall of the furnace 12, so that the substrate 70 in the furnace 12 is heated.

The mist supply apparatus 20 includes a mist generation tank 22. The mist generation tank 22 includes a water tank 24, a solution reservoir 26, and an ultrasonic transducer 28. The water tank 24 is a container a top of which is open, and stores water 58 therein. The ultrasonic transducer 28 is placed at a bottom of the water tank 24. The ultrasonic transducer 28 applies ultrasonic vibration to the water 58 in the water tank 24. The solution reservoir 26 is an enclosed container. The solution reservoir 26 stores a solution 60 that contains a material of a film to be epitaxially grown on the surface of the substrate 70. For example, when a gallium oxide ($Ga_2O_3$) film is to be epitaxially grown, a solution in which gallium is dissolved can be used as the solution 60. Moreover, a material for adding an n-type or p-type dopant to the gallium oxide film (e.g., ammonium fluoride or the like) may further be dissolved in the solution 60. Moreover, hydrochloric acid may be contained in the solution 60. The solution reservoir 26 has its bottom sunk in the water 58 in the water tank 24. A film constitutes a bottom of the solution reservoir 26. This facilitates transfer of ultrasonic vibration from the water 58 in the water tank 24 to the solution 60 in the solution reservoir 26. When the ultrasonic transducer 28 applies ultrasonic vibration to the water 58 in the water tank 24, the ultrasonic vibration is transferred to the solution 60 via the water 58. A surface of the solution 60 then vibrates, so that the mist 62 of the solution 60 is generated in a space above the solution 60 (i.e., a space in the solution reservoir 26). The solution reservoir 26 does not have its inner surface provided with the coating layer 90.

The mist supply apparatus 20 further includes a mist supply path 40, a carrier gas supply path 42, and a diluent gas supply path 44.

An upstream end of the mist supply path 40 is connected to an upper surface of the solution reservoir 26. A downstream end of the mist supply path 40 is connected to the upstream end 12a of the furnace 12. The mist supply path 40 supplies the mist 62 from the solution reservoir 26 to the furnace 12. A downstream portion of the mist supply path 40 (a portion close to the furnace 12) has an inner surface coated with the coating layer 90 (boron nitride). An upstream portion of the mist supply path 40 (a portion close to the solution reservoir 26) does not have its inner surface provided with the coating layer 90.

A downstream end of the carrier gas supply path 42 is connected to an upper portion of a side surface of the solution reservoir 26. An upstream end of the carrier gas supply path 42 is connected to a carrier gas supply source not shown. The carrier gas supply path 42 supplies carrier gas 64 from the carrier gas supply source to the solution reservoir 26. The carrier gas 64 is nitrogen gas or another inert gas. The carrier gas 64 that has flowed into the solution reservoir 26 flows from the solution reservoir 26 to the mist supply path 40. At this occasion, the mist 62 in the solution reservoir 26 flows to the mist supply path 40 with the carrier gas 64. The carrier gas supply path 42 does not have its inner surface provided with the coating layer 90.

A downstream end of the diluent gas supply path 44 is connected to some midpoint of the mist supply path 40. An upstream end of the diluent gas supply path 44 is connected to a diluent gas supply source not shown. The diluent gas supply path 44 supplies diluent gas 66 from the diluent gas supply source to the mist supply path 40. The diluent gas 66 is nitrogen gas or another inert gas. The diluent gas 66 that has flowed into the mist supply path 40 flows to the furnace 12 with the mist 62 and the carrier gas 64. The mist 62 in the mist supply path 40 is diluted by the diluent gas 66. The diluent gas supply path 44 does not have its inner surface provided with the coating layer 90.

Next, a film formation method using the film formation apparatus 10 will be described. Here, a substrate constituted of a single crystal of β-gallium oxide (β-$Ga_2O_3$) is used as the substrate 70. Moreover, an aqueous solution in which gallium chloride ($GaCl_3$, $Ga_2Cl_6$) and ammonium fluoride ($NH_4F$) are dissolved is used as the solution 60. Moreover, nitrogen gas is used as the carrier gas 64 and nitrogen gas is used as the diluent gas 66.

At first, the substrate 70 is placed on the substrate stage 13 in the furnace 12. Next, the substrate 70 is heated by the heater 14. Here, a temperature of the substrate 70 is controlled to approximately 750° C. When the temperature of the substrate 70 has stabilized, the mist supply apparatus 20 is activated. In other words, the ultrasonic transducer 28 is activated so as to generate the mist 62 of the solution 60 in the solution reservoir 26. Simultaneously, the carrier gas 64 is introduced from the carrier gas supply path 42 into the solution reservoir 26, and the diluent gas 66 is introduced from the diluent gas supply path 44 into the mist supply path 40. The carrier gas 64 passes through the solution reservoir 26, and as shown by an arrow 50, flows into the mist supply path 40. At this occasion, the mist 62 in the solution reservoir 26 flows into the mist supply path 40 with the carrier gas 64. Moreover, the diluent gas 66 is mixed with the mist 62 in the mist supply path 40. The mist 62 is thereby diluted. The mist 62, together with nitrogen gas (i.e., the carrier gas 64 and the diluent gas 66), flows downstream in the mist supply path 40, and as shown by an arrow 52, flows from the mist supply path 40 into the furnace 12. In the furnace 12, the mist 62 flows toward the downstream end 12b with the nitrogen gas, and is discharged to the exhaust pipe 80.

A part of the mist 62 flowing through the furnace 12 adheres to the surface of the substrate 70 that is heated. A chemical reaction of the mist 62 (i.e., the solution 60) then occurs on the substrate 70. Consequently, β-gallium oxide (β-$Ga_2O_3$) is generated on the substrate 70. The mist 62 is continuously supplied to the surface of the substrate 70, so that a gallium oxide film is grown on the surface of the substrate 70. A single-crystal gallium oxide film is grown on the surface of the substrate 70. If the solution 60 contains a material of a dopant, the dopant is captured in the gallium oxide film. For example, if the solution 60 contains ammonium fluoride, a gallium oxide film doped with fluorine is formed.

As mentioned above, the mist 62 that has been generated in the solution reservoir 26 flows to the furnace 12 via the mist supply path 40. Therefore, the inner surface of the solution reservoir 26, the inner surface of the mist supply path 40, the inner surface of the furnace 12, and the surface of the substrate stage 13 are exposed to the mist 62. There may be a case where unintended impurities may leach into the mist from a material that constitutes the portion configured to be exposed to the mist. For example, if the portion configured to be exposed to the mist is constituted of quartz, silicon leaches from quartz into the mist. When the mist that contains unintended impurities, such as silicon, is supplied to the surface of the substrate 70, a gallium oxide film that contains the unintended impurities is grown on the surface of the substrate 70. In contrast to this, in the first embodiment, the inner surface of the downstream portion of the mist supply path 40, the inner surface of the furnace 12, and the surface of the substrate stage 13 are coated with the coating layer 90 (boron nitride). Boron nitride is extremely stable, chemically. The coating layer 90 suppresses leaching of impurities into the mist 62 from the inner surface of the downstream portion of the mist supply path 40, the inner surface of the furnace 12, and the surface of the substrate stage 13. This suppresses unintended inclusion of impurities into a gallium oxide film grown on the surface of the substrate 70. According to the film formation apparatus 10 in the first embodiment, therefore, a gallium oxide film of high-purity can be formed. The furnace 12 and the substrate stage 13, which are heated by the heater 14, and the downstream portion of the mist supply path 40 connected to the furnace 12, in particular, are raised to high temperature during a film-forming process. Impurities thus are highly likely to leach into the mist 62 from the furnace 12, the substrate stage 13, and the downstream portion of the mist supply path 40. In the first embodiment, these portions raised to high temperature are coated with the coating layer 90, so that the leaching of impurities into the mist 62 can be reduced effectively, and inclusion of unintended impurities into a gallium oxide film can be reduced effectively.

Moreover, the mist 62 also adheres to the inner surface of the furnace 12, and hence a gallium oxide film is also grown on the inner surface of the furnace 12. If the inner surface of the furnace 12 is not coated with the coating layer 90, and an outer wall of the furnace 12 is transparent (e.g., the outer wall of the furnace 12 is made of quartz), the following problem occurs. In this case, since the furnace 12 has a transparent outer wall, the substrate 70 in the furnace 12 is irradiated with infrared rays generated from the heater 14, and is heated also by thermal radiation. In this case, the transparency of the outer wall of the furnace 12 decreases as the gallium oxide film grows on the inner surface of the furnace 12. Therefore, heating efficiency of the substrate 70 decreases as the gallium oxide film grows on the inner surface of the furnace 12. In contrast to this, when the inner surface of the furnace 12 is coated with the coating layer 90 (boron nitride) that is opaque, the outer wall of the furnace 12 blocks infrared rays. Therefore, even if the gallium oxide film is grown on the inner surface of the furnace 12, the heating efficiency of the substrate 70 remains almost unchanged. As such, coating the inner surface of the furnace 12 with the coating layer 90 reduces changes in the heating efficiency of the substrate 70, and allows more stable growth of a gallium oxide film on the substrate 70.

Second Embodiment

Figure 2:
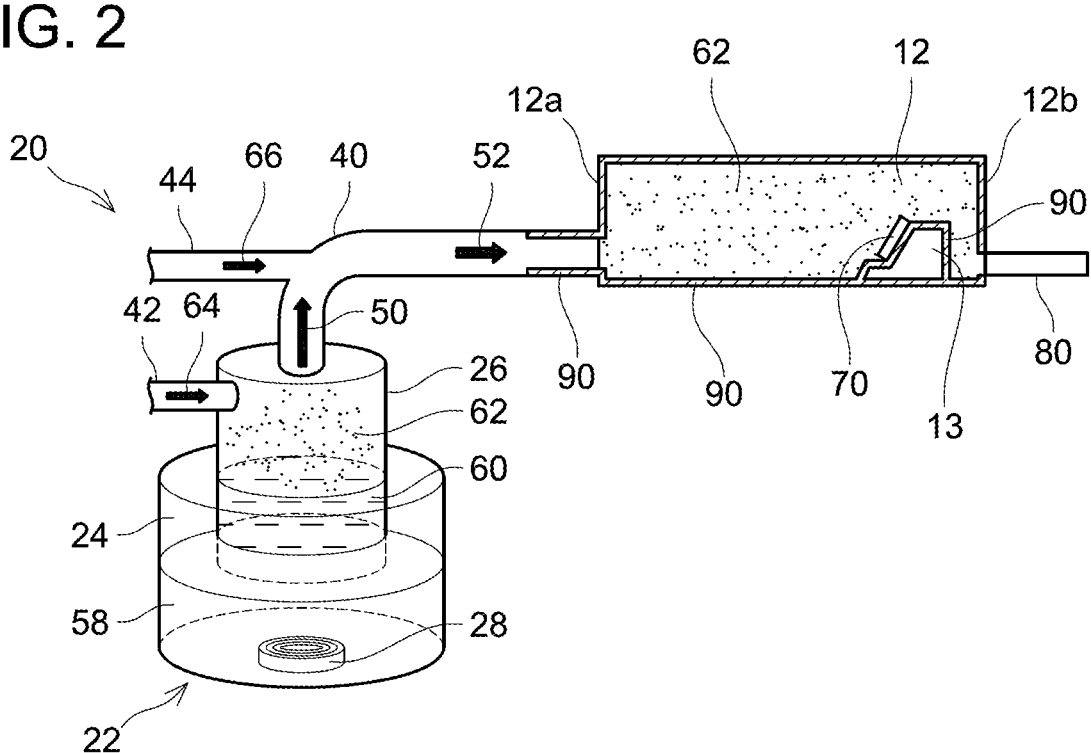
FIG. 2 is a configuration diagram of a film formation apparatus in a second embodiment.

A film formation apparatus in a second embodiment shown in FIG. 2 is a film formation apparatus that does not include a heater 14 outside a furnace 12 (a so-called cold wall-type film formation apparatus). In the second embodiment, a substrate stage 13 incorporates a heater therein. A substrate 70 is thus heated from a substrate stage 13 side.

In the film formation apparatus in the second embodiment as well, an inner surface of a downstream portion of a mist supply path 40, an inner surface of the furnace 12, and a surface of the substrate stage 13 are coated with a coating layer 90 (boron nitride). As in the first embodiment, therefore, unintended inclusion of impurities into a gallium oxide film can be reduced.

Moreover, in the cold wall-type film formation apparatus as well, a gallium oxide film is grown on the inner surface of the furnace 12. If the inner surface of the furnace 12 is not coated with the coating layer 90, and an outer wall of the furnace 12 is transparent, the following problem occurs. In the cold wall-type film formation apparatus, if the furnace 12 has a transparent outer wall, infrared rays generated from the substrate stage 13 heated by the heater are emitted to an outside of the furnace 12. However, since growth of the gallium oxide film on the inner surface of the furnace 12 decreases the transparency of the outer wall of the furnace 12, the infrared rays generated from the substrate stage 13 are difficult to be emitted to the outside of the furnace 12. Heating efficiency of the substrate 70 increases accordingly. As such, in the cold wall-type film formation apparatus as well, a problem occurs where, if the furnace 12 has a transparent outer wall, the decreased transparency of the outer wall changes the heating efficiency of the substrate 70. In contrast to this, as in the second embodiment, coating the inner surface of the furnace 12 with the coating layer 90 (boron nitride) that is opaque reduces changes in the heating efficiency of the substrate 70, and allows a gallium oxide film to be grown on the substrate 70 more stably.

Third Embodiment

Figure 3:
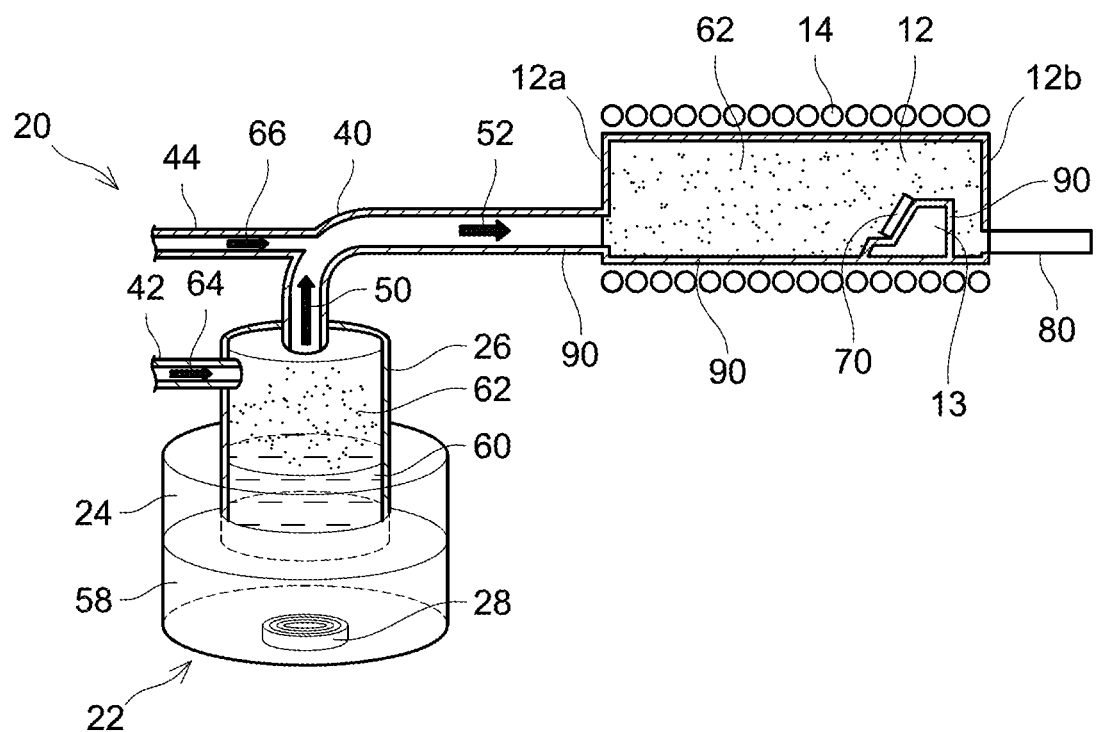
FIG. 3 is a configuration diagram of a film formation apparatus in a third embodiment.

A film formation apparatus in a third embodiment shown in FIG. 3 is a hot wall-type film formation apparatus similar to that in the first embodiment. In other words, a furnace 12 is heated by a heater 14. In the third embodiment, as in the first embodiment, an inner surface of the furnace 12 and a surface of a substrate stage 13 are coated with a coating layer 90. Moreover, in the third embodiment, an entirety of an inner surface of a mist supply path 40 is coated with the coating layer 90. Moreover, in the third embodiment, an entirety of an inner surface of a solution reservoir 26, except for its bottom, is coated with the coating layer 90. As such, allowing the entirety of a portion configured to be exposed to mist 62 to be constituted of boron nitride can more reliably reduce leaching of impurities into the mist 62. Moreover, in the third embodiment, an inner surface of a carrier gas supply path 42 and an inner surface of a diluent gas supply path 44 are also coated with the coating layer 90. This can further reduce leaching of impurities into the mist 62. According to the configuration in the third embodiment, therefore, unintended inclusion of impurities into a film to be grown can further be reduced.

It should be noted that, boron nitride has relatively low mechanical strength, and tends to peel off easily. Therefore, prior to the film-forming process on the surface of the substrate 70, a preparatory treatment may be conducted, which will be described below.

In the preparatory treatment, with the substrate 70 not being placed in the furnace 12, mist is supplied from the solution reservoir 26 to the furnace 12 while the furnace 12 is heated. Here, mist of a liquid same as the solution 60 used in the film-forming process may be used, or mist of a liquid that includes some of components of the solution 60 may be used. When the mist is supplied in the preparatory treatment, a thin film is grown on a surface of the coating layer 90. In other words, the surface of the coating layer 90 can further be coated. The coating layer 90 is thereby increased in strength, and can be prevented from peeling off. Moreover, in another embodiment, not the mist of the liquid, but the liquid itself, may be applied to the coating layer 90. After the preparatory treatment has finished, the substrate 70 is installed in the furnace 12, and the film-forming process can be conducted. Since the film that further coats the surface of the coating layer 90 includes components identical to those of the mist 62 (i.e., the solution 60) used in the film-forming process, failures are less likely to occur during the film-forming process. In the film-forming process, therefore, a gallium oxide film can be grown appropriately.

It should be noted that, the preparatory treatment, which has been described in the third embodiment, may also be performed in a cold wall-type film formation apparatus.

It should be noted that, although the coating layer 90 is made of boron nitride in the above-mentioned first to three embodiments, the coating layer 90 may be made of another material containing boron nitride. For example, the coating layer 90 may be constituted of a composite of boron nitride and alumina ($Al_2O_3$). Moreover, the coating layer 90 may be constituted of a composite of boron nitride and silicon nitride ($Si_3N_4$). As such, by using a composite of boron nitride and another material as the coating layer 90, mechanical strength of the coating layer 90 can be enhanced while taking advantage of chemical stability of boron nitride. Moreover, the material of the coating layer 90 may be modified depending on positions. For example, the coating layer 90 that coats the surface of the substrate stage 13 may be constituted of a composite of boron nitride and alumina, and the coating layer 90 that coats the inner surface of the furnace 12 may be constituted of a composite of boron nitride and silicon nitride.

Advantages of the material containing boron nitride will be described in comparison with other materials.

Carbon-based material has high heat resistance, but when exposed to mist, this material is oxidized by $H_2O$ in the mist and deteriorated. For example, if silicon carbide (SiC) is exposed to the mist and oxidized, silicon oxide ($SiO_2$) is formed, thereby causing deterioration. Moreover, if the mist contains HCl, HCl corrodes silicon oxide, thereby causing silicon to leach into the mist. This causes unintended inclusion of silicon into the gallium oxide film.

Quartz has high heat resistance. However, when quartz is exposed to the mist, silicon leaches from quartz into the mist. This causes unintended inclusion of silicon into the gallium oxide film.

Alumina, zirconia ($ZrO_2$), or the like has high heat resistance, but tends to be deteriorated by temperature changes. The film formation apparatus that uses mist experiences relatively large temperature changes when the mist is introduced therein. The temperature changes tend to cause deterioration of alumina or zirconia. Because its deteriorated portion causes impurities to leach therefrom into the mist, or adsorbs components of the mist, components of the gallium oxide film become difficult to control as intended.

In contrast to this, boron nitride or the materials containing boron nitride do not have the above-mentioned problems that arise in carbon-based material, quartz, alumina, or zirconia, and hence a gallium oxide film can be grown suitably with boron nitride or the materials containing boron nitride.

As described above, allowing the portion configured to be exposed to the mist 62 on an upstream side of the substrate 70 to be constituted of the material containing boron nitride can reduce inclusion of unintended impurities into a grown film.

It should be noted that, in the above-mentioned first to three embodiments, the case of growing a gallium oxide film is described as an example. However, a grown film, i.e., what is grown, can be selected arbitrarily. Moreover, the material(s) for the solution 60 and the substrate 70 can be selected arbitrarily in accordance with the film to be grown.

Moreover, in the above-mentioned first to three embodiments, the case of growing the film on the surface of the substrate having the plate shape is described as an example. However, a film may be grown on a surface of a substrate having a shape other than a plate.

Moreover, in the above-mentioned first to three embodiments, the case of epitaxially growing the single-crystal film on the surface of the substrate is described as an example. However, a grown film is not limited to a single-crystal film, and may be a polycrystalline or amorphous film, or the like.

Moreover, the positions of the coating layer 90 may be differed from the positions in the above-mentioned first to three embodiments. For example, only a part of the inner surface of the furnace 12 may be provided with the coating layer 90. The coating layer 90 may only need to be provided on at least a part of the portion configured to be exposed to the mist 62 on the upstream side of the substrate 70.

Some of the features characteristic disclosed herein will be listed as below. It should be noted that the respective technical elements are independent of one another, and are useful solely or in combinations.

In an example of the film formation apparatus disclosed herein, at least a part of an inner surface of the furnace may be constituted of the material comprising boron nitride.

If the furnace has a transparent outer wall, infrared rays generated from the heater pass through the outer wall. The mist adheres to the inner surface of the furnace, so that a film is grown on the inner surface of the furnace, and this film is substantially identical to the film grown on the surface of the substrate. If the furnace is transparent, growth of the film on the inner surface of the furnace decreases the transparency of the furnace. Consequently, infrared permeability of the furnace decreases, and heating efficiency of the substrate changes. In contrast to this, if at least a part of the inner surface of the furnace is constituted of the material containing boron nitride, infrared rays are blocked by the material containing boron nitride owing to its opaqueness. Even if a film is grown on the inner surface of the furnace, the material containing boron nitride is originally opaque, so that the infrared permeability of the furnace remains almost unchanged, and heating efficiency of the substrate is less likely to change. According to this film formation apparatus, therefore, a film can be formed more stably.

A method of growing a film using the film formation apparatus disclosed herein is proposed, and the method may comprise: supplying a liquid or mist of the liquid to the material comprising boron nitride so as to coat a surface of the material comprising boron nitride, the liquid comprising a component included in the solution; and in a state where the substrate is placed in the furnace after the coating of the material, supplying the mist of the solution from the mist supply apparatus to the furnace so as to grow the film on the surface of the substrate.

According to this configuration, the surface of the material containing boron nitride can be coated prior to the growing of the film, so that peeling off of the material containing boron nitride during the growing of the film can be reduced.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:

1. A method of growing a film using a film formation apparatus configured to supply a mist of a solution to a surface of a substrate to grow the film on the surface of the substrate, the film formation apparatus comprising:
    a furnace configured to house the substrate and to heat the substrate;
    a mist supply apparatus configured to supply the mist of the solution to the furnace;
    a portion configured to be exposed to the mist; and
    at least a part of the portion of the film formation apparatus is constituted of a material comprising boron nitride,
    the method comprising:
    in a state where the substrate is not placed in the furnace, supplying a liquid or mist of the liquid to the material comprising boron nitride so as to coat a surface of the material comprising boron nitride, the liquid comprising a component included in the solution; and in a state where the substrate is placed in the furnace after the coating of the material, supplying the mist of the solution from the mist supply apparatus to the furnace so as to grow the film on the surface of the substrate.

2. The method according to claim 1, wherein the liquid comprises all of the same components as the solution.

* * * * *